US006602791B2

(12) United States Patent
Ouellet et al.

(10) Patent No.: US 6,602,791 B2

(45) Date of Patent: Aug. 5, 2003

(54) MANUFACTURE OF INTEGRATED FLUIDIC DEVICES

(75) Inventors: Luc Ouellet, Granby (CA); Heather Tyler, Bromont (CA)

(73) Assignee: Dalsa Semiconductor Inc., Waterloo (CA)

(*) Notice: Subject to any disclaimer, the term of this patent is extended or adjusted under 35 U.S.C. 154(b) by 82 days.

(21) Appl. No.: 09/842,836

(22) Filed: Apr. 27, 2001

(65) Prior Publication Data

US 2002/0160561 A1 Oct. 31, 2002

(51) Int. Cl.[7] ..................... H01L 21/311

(52) U.S. Cl. ..................... 438/696; 438/700; 438/720; 438/756

(58) Field of Search ..................... 438/52, 696, 700, 438/703, 735, 720, 723, 724, 756; 257/734, 735; 216/2, 11, 17, 41, 51, 78, 79

(56) References Cited

U.S. PATENT DOCUMENTS 5,127,990 A * 7/1992 Pribat et al. ................ 156/644
5,156,988 A * 10/1992 Mori et al. ................ 437/40
5,690,841 A 11/1997 Elderstig ................ 216/39
5,698,112 A * 12/1997 Naeher et al. ................ 216/2
6,060,398 A * 5/2000 Brintzinger et al. ........ 438/696
6,093,330 A * 7/2000 Chong et al. ................ 216/2
6,136,212 A 10/2000 Mastrangelo et al. ......... 216/49
6,150,275 A * 11/2000 Cho et al. ................ 438/696
6,180,536 B1 1/2001 Chong et al. ................ 438/745

FOREIGN PATENT DOCUMENTS

WO WO 92/15408 9/1992

* cited by examiner

*Primary Examiner*—Benjamin L. Utech
*Assistant Examiner*—Duy-Vu Deo
(74) *Attorney, Agent, or Firm*—Marks & Clerk

(57) ABSTRACT

In a method of fabricating a microstructure for microfluidics applications, a first layer of etchable material is formed on a suitable substrate. A mechanically stable support layer is formed over the etchable material. A mask is applied over the support to expose at least one opening in the mask. An anistropic etch is then performed through the opening to create a bore extending through the support layer to said layer of etchable material. After performing an isotropic etch through the bore to form a microchannel in the etchable material extending under the support layer, a further layer is deposited over the support layer until overhanging portions meet and thereby close the microchannel formed under the opening.

42 Claims, 15 Drawing Sheets

MANUFACTURE OF INTEGRATED FLUIDIC DEVICES

BACKGROUND OF THE INVENTION

1. Field of the Invention

This invention relates to the field of integrated device fabrication, and more particularly to the manufacture of integrated devices for use in microfluidics applications, such biological applications; in the latter case such devices are often known as biochips. Biochips require the fabrication of micro-channels for the processing of biological fluids, and the present invention relates a method of fabricating such channels.

2. Description of the Prior Art

The prior art is generally divided into two types of device: Passive and Active. Both types include microchannels for the transport of biological fluids. In passive devices all the control circuitry for fluid flow is on external circuitry. Active devices include control circuitry incorporated directly into the biochip.

The following granted U.S.A. Patents show the Prior Art concerning the fabrication of micro-channel biochips for the processing of biological fluids: U.S. Pat. No. 6,186,660, "Microfluidic systems incorporating varied channel dimensions"; U.S. Pat. No. 6,180,536, "Suspended moving channels and channel actuators for . . . "; U.S. Pat. No. 6,174,675, "Electrical current for controlling fluid parameters in . . . "; U.S. Pat. No. 6,172,353, "System and method for measuring low power signals"; U.S. Pat. No. 6,171,865, "Simultaneous analyte determination and reference balancing . . . ; U.S. Pat. No. 6,171,850, "Integrated devices and systems for performing temperature . . . "; U.S. Pat. No. 6,171,067, "Micropump"; U.S. Pat. No. 6,170,981, "In situ micromachined mixer for microfluidic analytical . . . "; U.S. Pat. No. 6,167,910, "Multi-layer microfluidic devices"; U.S. Pat. No. 6,159,739, "Device and method for 3-dimensional alignment of particles . . . "; U.S. Pat. No. 6,156,181, "Controlled fluid transport microfabricated polymeric substrates"; U.S. Pat. No. 6,154,226, "Parallel print array"; U.S. patent No. substrates"; U.S. Pat. No. 6,154,226, "Parallel print array"; U.S. Pat. No. 6,153,073, "Microfluidic devices incorporating improved channel . . . "; U.S. Pat. No. 6,150,180, "High throughput screening assay systems in microscale . . . "; U.S. Pat. No. 6,150,119, "Optimized high-throughput analytical system "; U.S. Pat. No. 6,149,870, "Apparatus for in situ concentration and/or dilution of . . . "; U.S. Pat. No. 6,149,787, "External material accession systems and methods"; U.S. Pat. No. 6,148,508, "Method of making a capillary for electrokinetic transport of . . . "; U.S. Pat. No. 6,146,103, "Micromachined magnetohydrodynamic actuators and sensors "; U.S. Pat. No. 6,143,248, "Capillary microvalve"; U.S. Pat. No. 6,143,152, "Microfabricated capillary array electrophoresis device and . . . "; U.S. Pat. No. 6,137,501, "Addressing circuitry for microfluidic printing apparatus"; U.S. Pat. No. 6,136,272, "Device for rapidly joining and splitting fluid layers"; U.S. Pat. No. 6,136,212, "Polymer-based micromachining for microfluidic devices"; U.S. Pat. No. 6,132,685, "High throughput microfluidic systems and methods"; U.S. Pat. No. 6,131,410, "Vacuum fusion bonding of glass plates"; U.S. Pat. No. 6,130,098, "Moving microdroplets"; U.S. Pat. No. 6,129,854, "Low temperature material bonding technique"; U.S. Pat. No. 6,129,826, "Methods and systems for enhanced fluid transport"; U.S. Pat. No. 6,126,765, "Method of producing microchannel/microcavity structures"; U.S. Pat. No. 6,126,140, "Monolithic bi-directional microvalve with enclosed drive . . . "; U.S. Pat. No. 6,123,798, "Methods of fabricating polymeric structures incorporating . . . "; U.S. Pat. No. 6,120,666, "Microfabricated device and method for multiplexed . . . "; U.S. Pat. No. 6,118,126, "Method for enhancing fluorescence"; U.S. Pat. No. 6,107,044, "Apparatus and methods for sequencing nucleic acids in . . . "; U.S. Pat. No. 6,106,685, "Electrode combinations for pumping fluids"; U.S. Pat. No. 6,103,199, "Capillary electroflow apparatus and method"; U.S. Pat. No. 6,100,541, "Microfluidic devices and systems incorporating integrated . . . "; U.S. Pat. No. 6,096,656, "Formation of microchannels from low-temperature . . . "; U.S. Pat. No. 6,091,502, "Device and method for performing spectral measurements in . . . "; U.S. Pat. No. 6,090,251, "Microfabricated structures for facilitating fluid introduction . . . "; U.S. Pat. No. 6,086,825, "Microfabricated structures for facilitating fluid introduction . . . "; U.S. Pat. No. 6,086,740. "Multiplexed microfluidic devices and systems"; U.S. Pat. No. 6,082,140, "Fusion bonding and alignment fixture "; U.S. Pat. No. 6,080,295, "Electropipettor and compensation means for electrophoretic . . . "; U.S. Pat. No. 6,078,340, "Using silver salts and reducing reagents in microfluidic printing"; U.S. Pat. No. 6,074,827, "Microfluidic method for nucleic acid purification and processing"; U.S. Pat. No. 6,074,725, "Fabrication of microfluidic circuits by printing techniques"; U.S. Pat. No. 6,073,482, "Fluid flow module"; U.S. Pat. No. 6,071,478, "Analytical system and method"; U.S. Pat. No. 6,068,752, "Microfluidic devices incorporating improved channel . . . "; U.S. Pat. No. 6,063,589, "Devices and methods for using centripetal acceleration to . . . "; U.S. Pat. No. 6,062,261, "MicrofluIdic circuit designs for performing electrokinetic . . . "; U.S. Pat. No. 6,057,149, "Microscale devices and reactions in microscale devices"; U.S. Pat. No. 6,056,269, "Microminiature valve having silicon diaphragm"; U.S. Pat. No. 6,054,277, "Integrated microchip genetic testing system"; U.S. Pat. No. 6,048,734, "Thermal microvalves in a fluid flow method"; U.S. Pat. No. 6,048,498, "Microfluidic devices and systems"; U.S. Pat. No. 6,046,056, "High throughput screening assay systems in microscale . . . "; U.S. Pat. No. 6,043,080, "Integrated nucleic acid diagnostic device "; U.S. Pat. No. 6,042,710, "Methods and compositions for performing molecular separations"; U.S. Pat. No. 6,042,709, "Microfluidic sampling system and methods"; U.S. Pat. No. 6,012,902, "Micropump"; U.S. Pat. No. 6,011,252, "Method and apparatus for detecting low light levels"; U.S. Pat. No. 6,007,775, "Multiple analyte diffusion based chemical sensor"; U.S. Pat. No. 6,004,515, "Methods and apparatus for in situ concentration and/or . . . "; U.S. Pat. No. 6,001,231, "Methods and systems for monitoring and controlling fluid . . . "; U.S. Pat. No. 5,992,820, "Flow control in microfluidics devices by controlled bubble . . . "; U.S. Pat. No. 5,989,402, "Controller/detector interfaces for microfluidic systems"; U.S. Pat. No. 5,980,719, "Electrohydrodynamic receptor"; U.S. Pat. No. 5,972,710, "Microfabricated diffusion-based chemical sensor"; U.S. Pat. No. 5,972,187, "Electropipettor and compensation means for electrophoretic bias"; U.S. Pat. No. 5,965,410, "Electrical current for controlling fluid parameters in . . . "; U.S. Pat. No. 5,965,001, "Variable control of electroosmotic and/or electrophoretic . . . "; U.S. Pat. No. 5,964,995, "Methods and systems for enhanced fluid transport"; U.S. Pat. No. 5,958,694, "Apparatus and methods for sequencing nucleic acids in . . . "; U.S. Pat. No. 5,958,203, "Electropipettor and compensation means for electrophoretic bias"; U.S. Pat. No. 5,957,579, "Microfluidic systems incorporating varied channel dimensions"; U.S. Pat.

No. 5,955,028, "Analytical system and method"; U.S. Pat. No. 5,948,684, "Simultaneous analyte determination and reference balancing . . . "; U.S. Pat. No. 5,948,227, "Methods and systems for performing electrophoretic . . . "; U.S. Pat. No. 5,942,443, "High throughput screening assay systems in microscale"; U.S. Pat. No. 5,932,315, "Microfluidic structure assembly with mating microfeatures"; U.S. Pat. No. 5,932,100, "Microfabricated differential extraction device and method . . . "; U.S. Pat. No. 5,922,604, "Thin reaction chambers for containing and handling liquid . . . "; U.S. Pat. No. 5,922,210, "Tangential flow planar microfabricated fluid filter and method . . . "; U.S. Pat. No. 5,885,470, "Controlled fluid transport in microfabricated polymeric . . . "; U.S. Pat. No. 5,882,465, "Method of manufacturing microfluidic devices"; U.S. Pat. No. 5,880,071, "Electropipettor and compensation means for electrophoretic bias"; U.S. Pat. No. 5,876,675, "Microfluidic devices and systems"; U.S. Pat. No. 5,869,004, "Methods and apparatus for in situ concentration and/or . . . "; U.S. Pat. No. 5,863,502, "Parallel reaction cassette and associated devices"; U.S. Pat. No. 5,856,174, "Integrated nucleic acid diagnostic device"; U.S. Pat. No. 5,855,801, "IC-processed microneedles"; U.S. Pat. No. 5,852,495, "Fourier detection of species migrating in a microchannel"; U.S. Pat. No. 5,849,208, "Making apparatus for conducting biochemical analyses"; U.S. Pat. No. 5,842,787, "Microfluidic systems incorporating varied channel dimensions"; U.S. Pat. No. 5,800,690, "Variable control of electroosmotic and/or electrophoretic . . . "; U.S. Pat. No. 5,779,868, "Electropipettor and compensation means for electrophoretic bias"; U.S. Pat. No. 5,755,942, "Partitioned microelectronic device array"; U.S. Pat. No. 5,716,852, "Microfabricated diffusion-based chemical sensor"; U.S. Pat. No. 5,705,018, "Micromachined peristaltic pump"; U.S. Pat. No. 5,699,157, "Fourier detection of species migrating in a microchannel"; U.S. Pat. No. 5,591,139, ""IC-processed microneedles"; and U.S. Pat. No. 5,376,252, "Microfluidic structure and process for its manufacture".

The following published paper describes a polydimethylsiloxane (PDMS) biochip capable of capacitance detection of biological entities (mouse cells): L. L. Sohn, O. A. Saleh, G. R. Facer, A. J. Beavis, R. S. Allan, and D. A. Notterman, 'Capacitance cytometry: Measuring biological cells one by one', Proceedings of the National Academy of Siences (USA), Vol. 97, No. 20, Sep. 26, 2000, pp.10687–10690

The above US patents indicate that passive micro-channel biochip devices are largely fabricated from the combination of various polymer substrates, such as: acrylonitrile-butadiene-styrene copolymer, polycarbonate, polydimethylsiloxane (PDMS), polyethylene, polymethylmethacrylate (PMMA), polymethylpentene, polypropylene, polystyrene, polysulfone, polytetrafluoroethylene (PTFE), polyurethane, polyvinylchloride (PVC), polyvinylidine fluoride (PVF), or other polymer. In this case, lithography or mechanical stamping is used to define a network of micro-channels in one of these substrates, prior to the assembly and the thermally assisted bonding of this first substrate to another substrate. The result is a simple passive micro-channel biochip device which can be patterned with conductive layers for connection to an external processor that is used to initiate fluid movement by electrophoresis or electroosmosis, and for analysis and data generation. FIG. 1 shows an example of such a passive micro-channel biochip device obtained from the fusion of such polymeric substrates described in U.S. Pat. No. 6,167,910.

The prior art US patents also show that passive micro-channel biochip devices can be fabricated from the combination of various micro-machined silica or quartz substrates. Again, assembly and fusion bonding is required. The result is a simple passive biochip device which can be patterned with conductive layers for connection to an external processor. FIG. 2 shows an example of such passive micro-channel biochip device obtained from the fusion of such silica substrates as described in U.S. Pat. No. 6,131,410.

These prior art patents also show that passive micro-channel biochip devices can be fabricated from a passive micro-machined silicon substrate. In that case, the silicon substrate is used as a passive structural material. Again, assembly and fusion bonding of at least two sub-assemblies is required. The result is a simple passive biochip that has to be connected to an external processor. FIG. 3 shows an example of such a passive micro-channel biochip devices obtained from a passive micro-machined silicon substrate in accordance with the teachings of U.S. Pat. No. 5,705,018.

The prior patents also indicate that an active micro-reservoir biochip device can be fabricated from an active micro-machined silicon substrate. In this case, the control electronics integrated in the silicon substrate is used as an active on-chip fluid processor and communication device. The result is a sophisticated biochip which can perform, in pre-defined reservoirs, various fluidic operations, analysis and (remote) data communication functions without the need for an external fluid processor controlling fluid movement, analysis and data generation. FIG. 4 shows an example of an active micro-reservoir biochip devices obtained from an active micro-machined silicon substrate described in U.S. Pat. No. 6,117,643.

The published paper discloses that capacitance detection of biological entities can be performed on passive polydimethylsiloxane (PDMS) biochips using gold coated capacitor electrodes at a relatively low frequency of 1 kHz with and external detector. FIG. 5 shows an example of such passive polydimethylsiloxane (PDMS) biochips with gold electrodes.

SUMMARY OF THE INVENTION

The present invention relates to an improved fabrication technique of active micro-channel biochip devices from an active micro-machined silicon substrate that results in a sophisticated biochip device which can perform fluid movement and biological entities detection into micro-channels.

According to the present invention there is provided a method of fabricating a microstructure for microfluidics applications, comprising forming a layer of etchable material on a suitable substrate; forming a mechanically stable support layer over said etchable material; applying a mask over said support layer to expose at least one opening; performing an anistropic etch through the or each said opening to create a bore extending through said support layer into said layer of etchable material; performing an isotropic etch through the or each said bore to form a microchannel in said etchable material extending under said support layer; and forming a further layer of depositable material over said support layer until portions of said depositable layer overhanging the or each said opening meet and thereby close the microchannel formed under the or each said opening.

The invention involves the formation of a structure comprising a stack of layers. It will be appreciated by one skilled in the art that the critical layers do not necessarily have to be deposited directly on top of each other. It is possible that in certain applications intervenving layers may be present, and indeed in the preferred embodiment such layers, for example, a sacrificial TiN layer, are present under the support layer.

The invention offers a simple approach for the fabrication of active micro-channel biochip devices from an active micro-machined silicon substrate directly over a Complementary Metal Oxide Semiconductor device, CMOS device, or a high-voltage CMOS device.

CMOS devices are capable of very small detection levels, an important prerequisite in order to perform electronic capacitance detection (identification) of biological entities with low signal levels. CMOS devices can perform the required data processing and (remote) communication fonctions. High-voltage CMOS devices with adequate operation voltages and operation currents are capable of performing the required micro-fluidics in the micro-channels and allowing the integration of a complete Laboratory-On-A-Chip concept.

The invention discloses a technique for incorporating in existing CMOS and high-voltage CMOS processes the micro-machining steps which allow the development of the active micro-channels with attached electrodes used to provoke fluid movement and/or to identify biological entities. The micro-channels are closed using without the use of a second substrate and without the use of thermal bonding. In fact, all of the described micro-machining steps should preferably be carried out at a temperature not exceeding 450° C. in order to prevent the degradation of the underlying CMOS and high-voltage CMOS devices and, prevent any mechanical problems such as plastic deformation, peeling, cracking, de-lamination and other such high temperature related problems with the thin layers used in the micro-machining of the bio-chip.

The materials combination used in the described micro-machining sequence are not typical of Micro-Electro-Mechanical-Systems (MEMS) which typically use Low Pressure Chemical Vapour Deposited polysilicon, LPCVD polysilicon, and Plasma Enhanced Chemical Vapour Deposited silica, PECVD $SiO_2$, combinations. The use of LPCVD polysilicon is generally not suitable because of its required deposition temperature of more than 550° C.

The invention preferably employs as an innovative sacrificial material Collimated Reactive Physical Vapour Deposition of Titanium Nitride, CRPVD TiN. In this process the TiN is deposited with the assistance of a collimator, which directs the atoms onto the supporting surface. This sacrificial CRPVD TiN material is used because of its excellent mechanical properties, and its excellent selectivity to Isotropic Wet Etching solutions used to define the micro-channels in thick layers of Plasma Enhanced Chemical Vapour Deposited, PECVD, $SiO_2$.

Typically, the capacitor electrodes are either LPCVD polysilicon (deposited before the micro-machining steps) or Physical Vapour Deposited aluminum alloy, PVD Al-alloy.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
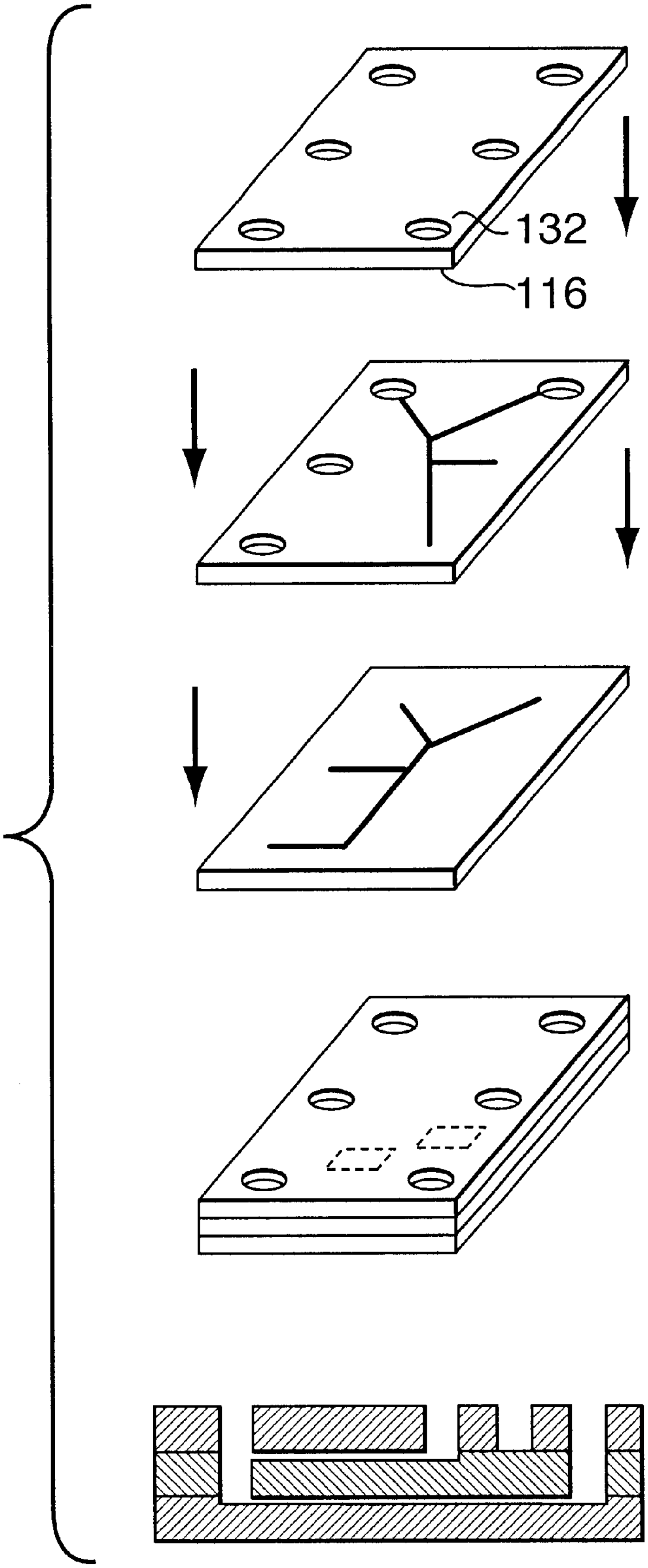
FIG. 1 shows one example of a passive micro-channel biochip device obtained from the fusion of polymeric substrates as described in U.S. Pat. No. 6,167,910.
Figure 2:
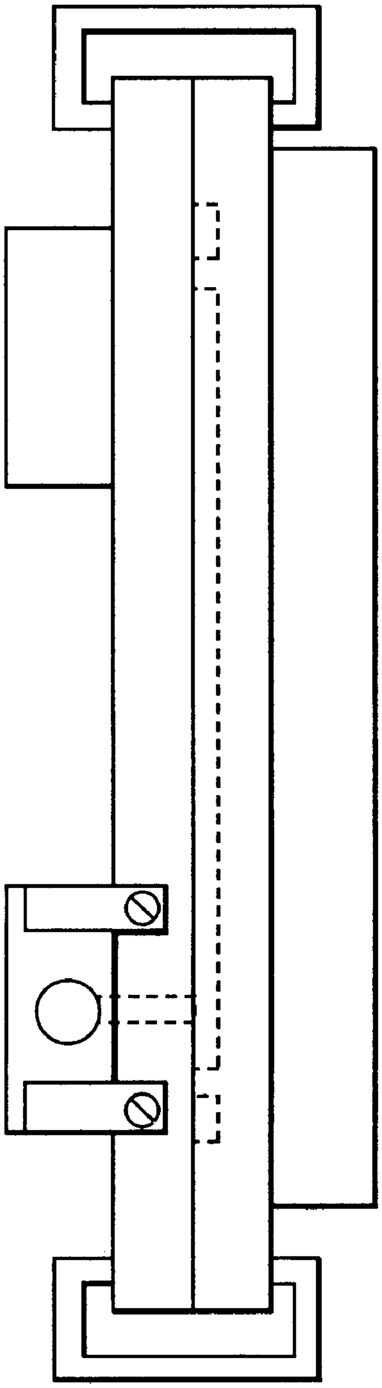
FIG. 2 shows one example of a passive micro-channel biochip device obtained from the fusion of silica substrates as described in U.S. Pat. No. 6,131,410.
Figure 3:
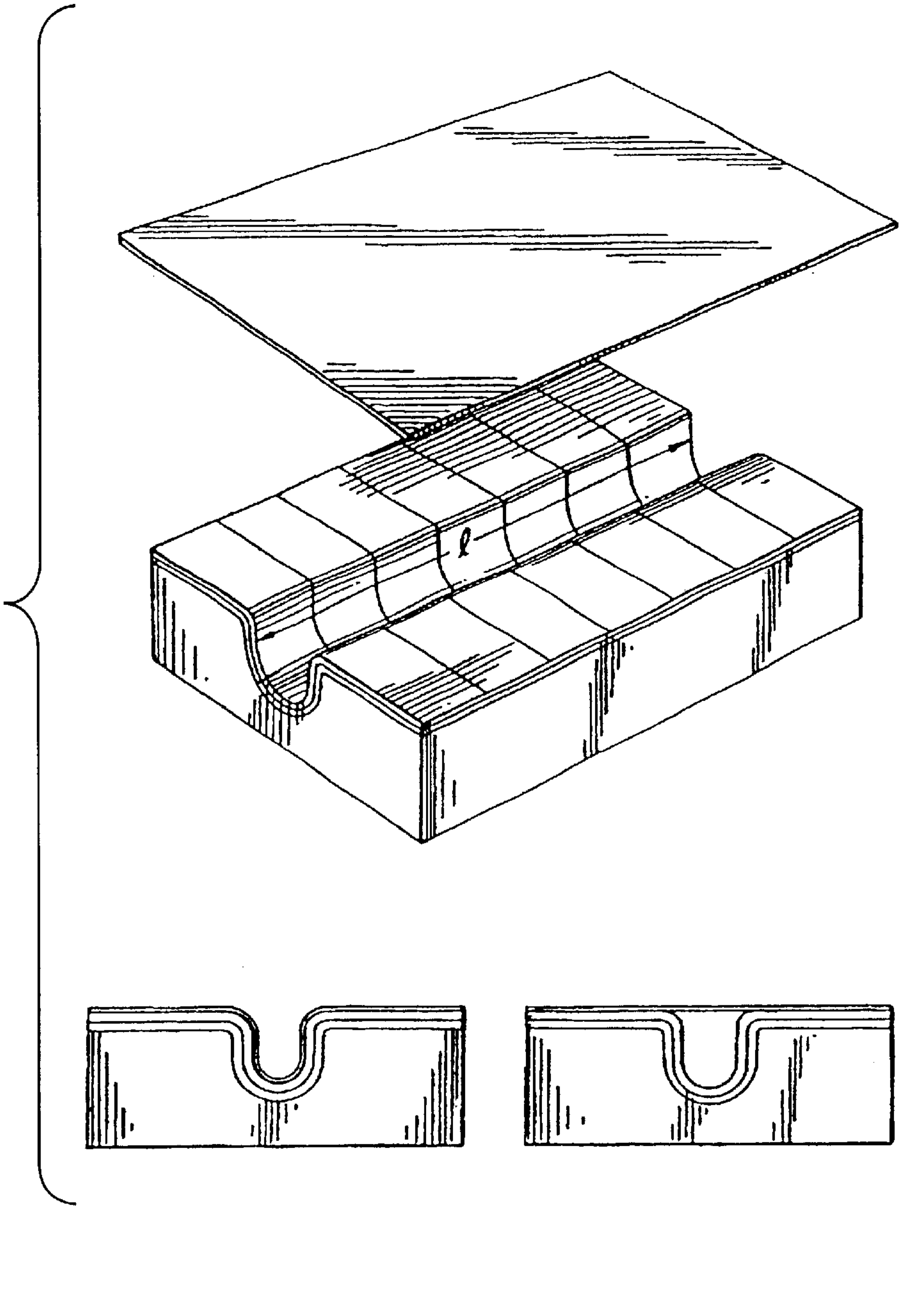
FIG. 3 shows one example of a passive micro-channel biochip device obtained from a passive micro-machined silicon substrate as described in U.S. Pat. No. 5,705,018.
Figure 4:
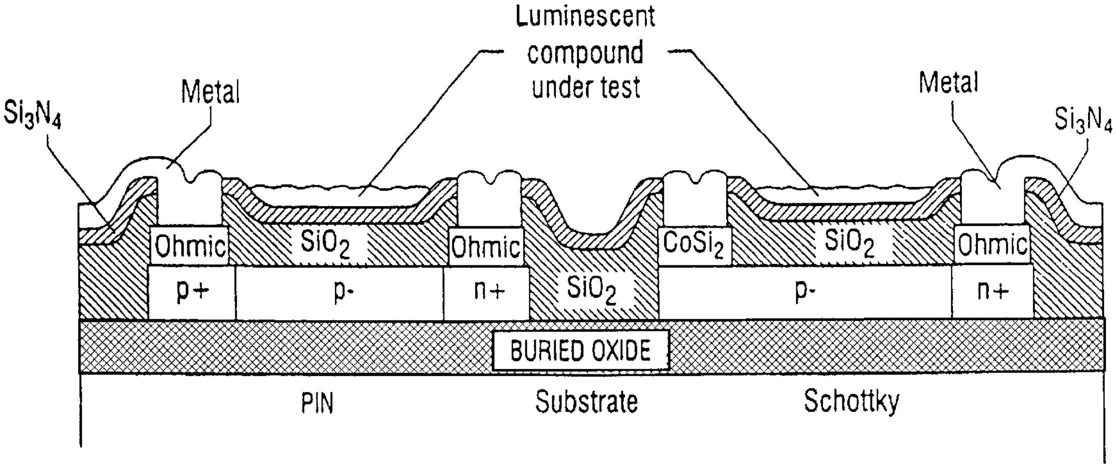
FIG. 4 shows one example of an active micro-reservoir biochip device obtained from an active micro-machined silicon substrate as descried in U.S. Pat. No. 6,117,643.
Figure 5A:
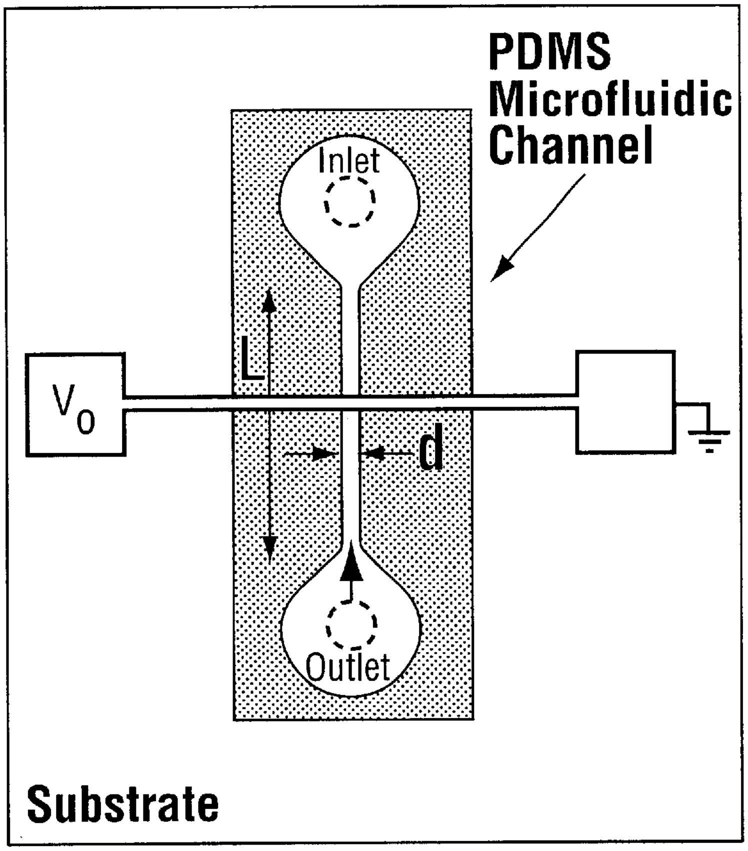
FIG. 5 shows one example of a passive polydimethylsiloxane (PDMS) biochip with gold electrodes as described in the article by L. L. Sohn, O. A. Saleh, G. R. Facer, A. J. Beavis, R. S. Allan, and D. A. Notterman, entitled 'Capacitance cytometry: Measuring biological cells one by one', Proceedings of the National Academy of Siences (USA), Vol. 97, No. 20, Sep. 26, 2000, pp.10687–10690)
Figure 5B:
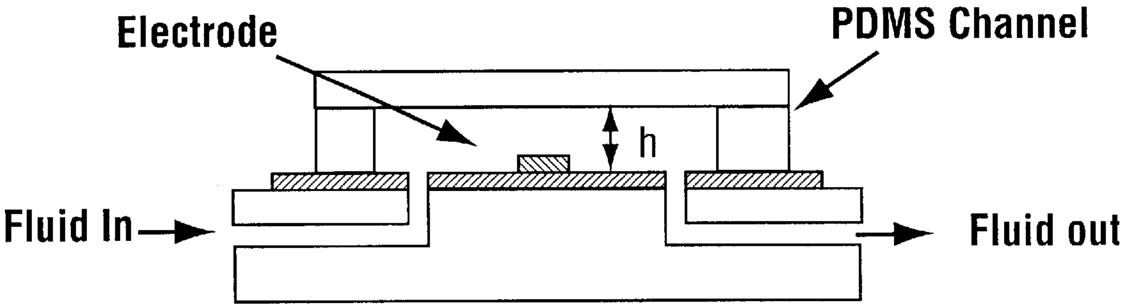
Figure 6:
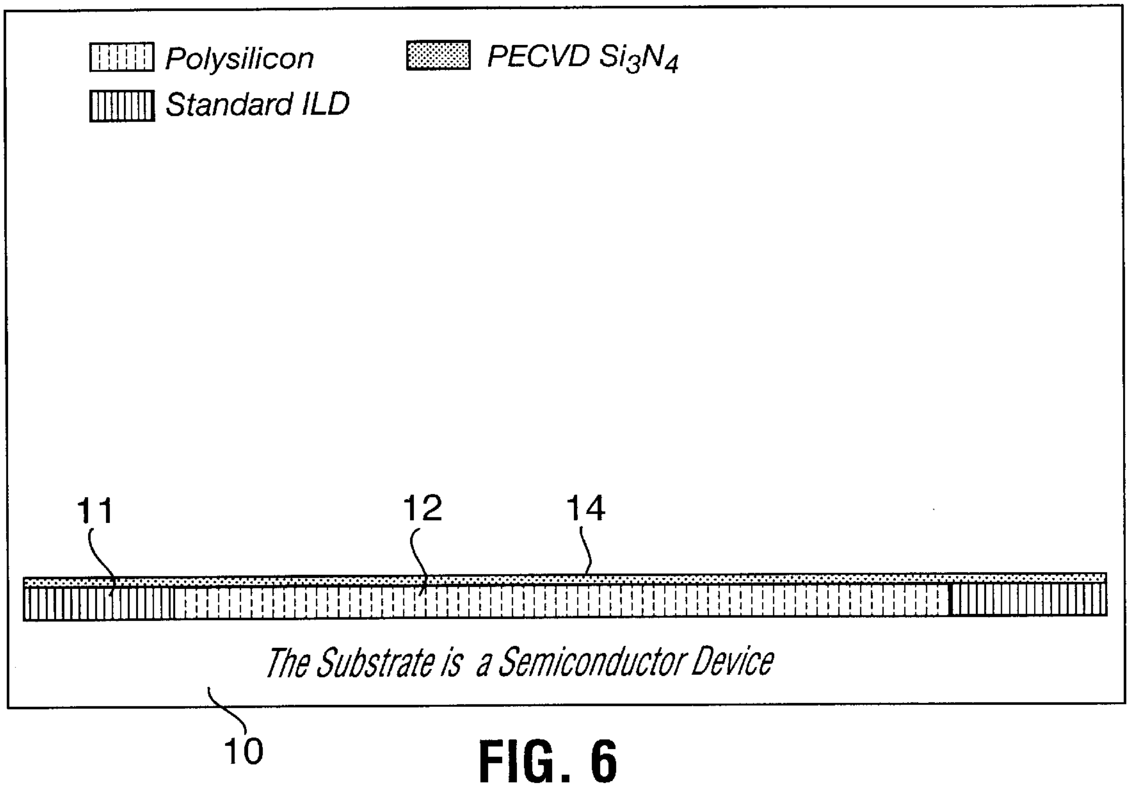
FIG. 6 illustrates step 1 of a biochip micro-machining sequence (Deposition of 0.1 $\mu$m of PECVD $Si_3N_4$ at 400° C.)

In accordance with the principles of the invention, a biochip chip is fabricated onto an existing CMOS or high-voltage CMOS device. Referring to FIG. 6, as a preparatory step, a conventional CMOS process is used to fabricate a CMOS device 10 up to the dielectric isolation 11 between the last LPCVD polysilicon level 12 and the first metallization level. The isolation dielectric 11, commonly referred to as the Inter Level Dielectric, ILD, is present before the beginning of the micro-machining steps. A contact is opened through this isolation dielectric to reach the last LPCVD polysilicon layer 12 which is used as an electrode connected to CMOS device for capacitance detection and/or as an electrode connected to high-voltage CMOS devices for fluid movement.

Figure 7:
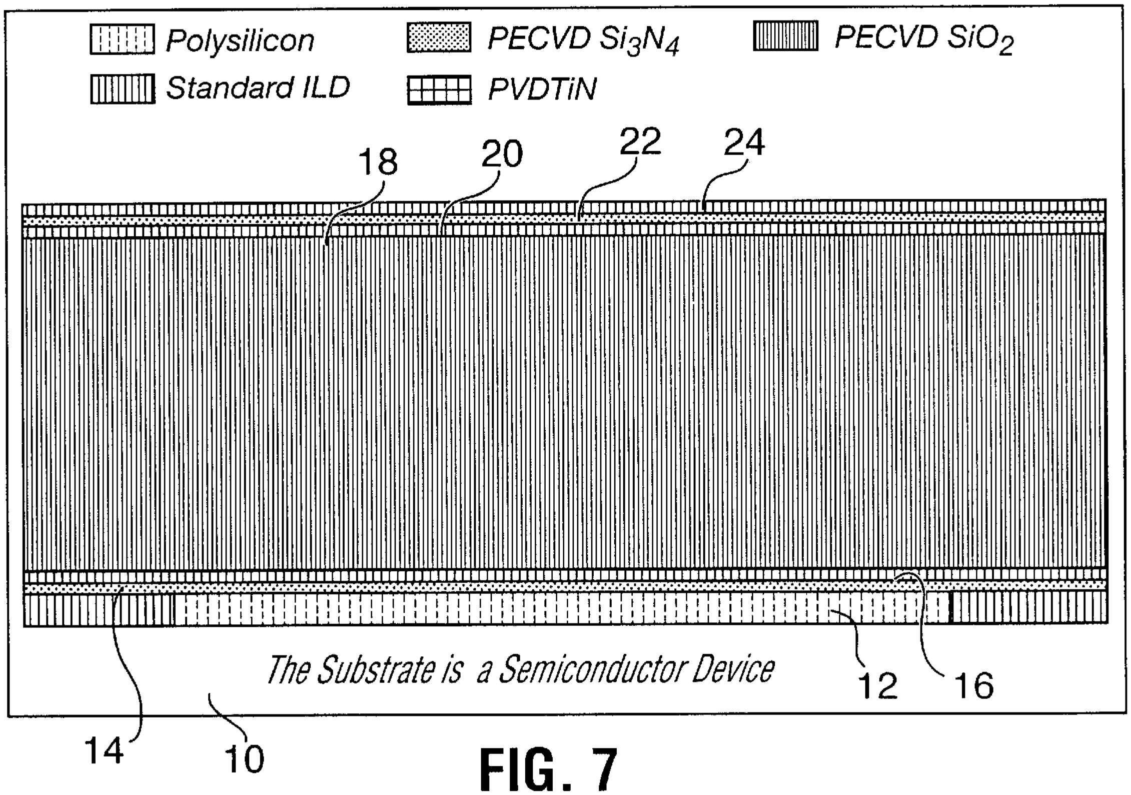
FIG. 7 illustrates steps 2 to 6 of the biochip micro-machining sequence (Deposition of 0.10 $\mu$m of CRPVD TiN at 400° C., Deposition of 10.0 $\mu$m of PECVD $SiO_2$ at 400° C., Deposition of 0.10 $\mu$m of CRPVD TiN at 400° C., Deposition of 0.40 $\mu$m of PECVD $Si_3N_4$ at 400° C., Deposition of 0.20 $\mu$m of CRPVD TiN at 400° C.)

After preparing the precursor device, a series of layers are deposited as shown in in the following figures. First, a layer 14 of about 0.10 $\mu$m of PECVD $Si_3N_4$ is deposited on layer 12 at 400° C. Next, as shown in FIG. 7 a series of layers are deposited on layer 14. First a layer 16 of about 0.10 $\mu$m of CRPVD TiN 16 is deposited at 400° C. After this, a layer 18 of about 10.0 $\mu$m of PECVD $SiO_2$ is deposited at 400° C.

Next, a layer 20 about 0.10 $\mu$m of CRPVD TiN at 400° C. is deposited on layer 18. In the next step, a layer 22 of about 0.40 $\mu$m of PECVD $Si_3N_4$ is deposited on layer 20 at 400° C. Subsequently, a layer 24 of about 0.20 $\mu$m of CRPVD TiN at 400° C.

Figure 8:
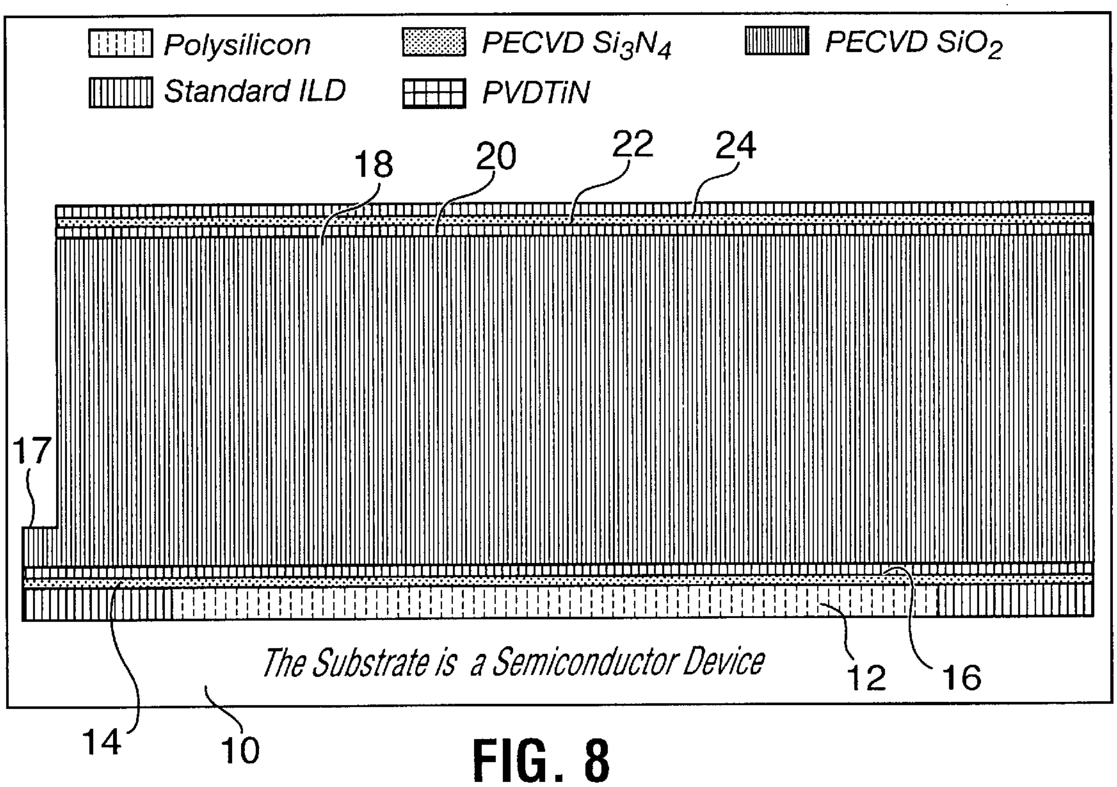
FIG. 8 illustrates step 7 of the biochip micro-machining sequence (1st Pattern Followed by Partial Anisotropic Reactive Ion Etch-back)

In the next step, as shown in FIG. 8, a first micro-machining mask is applied to define a MEMS region, and this is followed by the anisotropic reactive ion etching (Anisotropic RIE) of the CRPVD TiN/PECVD $Si_3N_4$/CRPVD TiN sandwich 20, 22, 24, followed by the partial anisotropic RIE of the PECVD $SiO_2$ layer 18 to form a shoulder 17.

Figure 9:
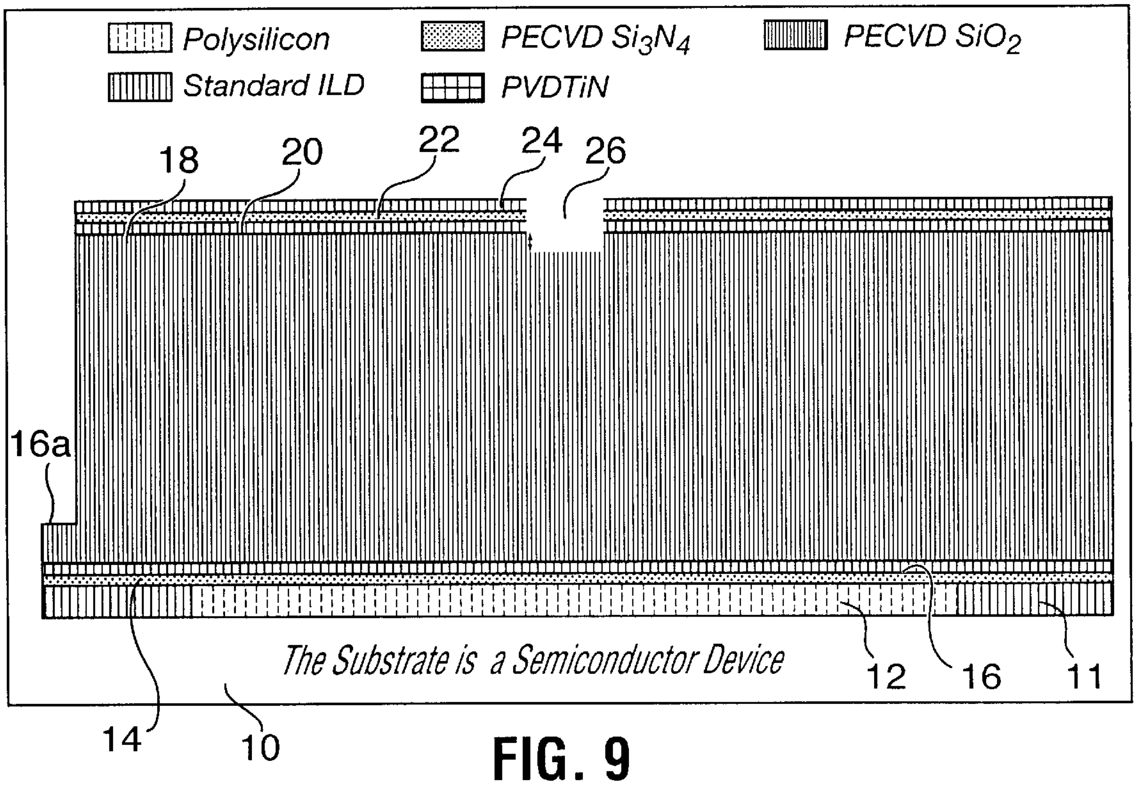
FIG. 9 illustrates step 8 of the biochip micro-machining sequence (2nd Pattern Followed by Anisotropic Reactive Ion Etch-back and Etch Holes)

Subsequently, as shown in FIG. 9, a $2^{nd}$ micro-machining mask is applied to define Isotropic Wet Etching openings 26. This is followed by an anisotropic RIE of the CRPVD TiN/PECVD $Si_3N_4$/CRPVD TiN sandwich 22, 24, 26 and followed by the completion of the Anisotropic RIE of the PECVD $SiO_2$ layer 18 outside the MEMS region as to reach the bottom CRPVD TiN layer 16 at 16*a* and remove the shoulder 17. The degree of penetration h of the anisotropic etch into the PECVD $SiO_2$ layer 18 of the future micro-channel is not critical.

Figure 10:
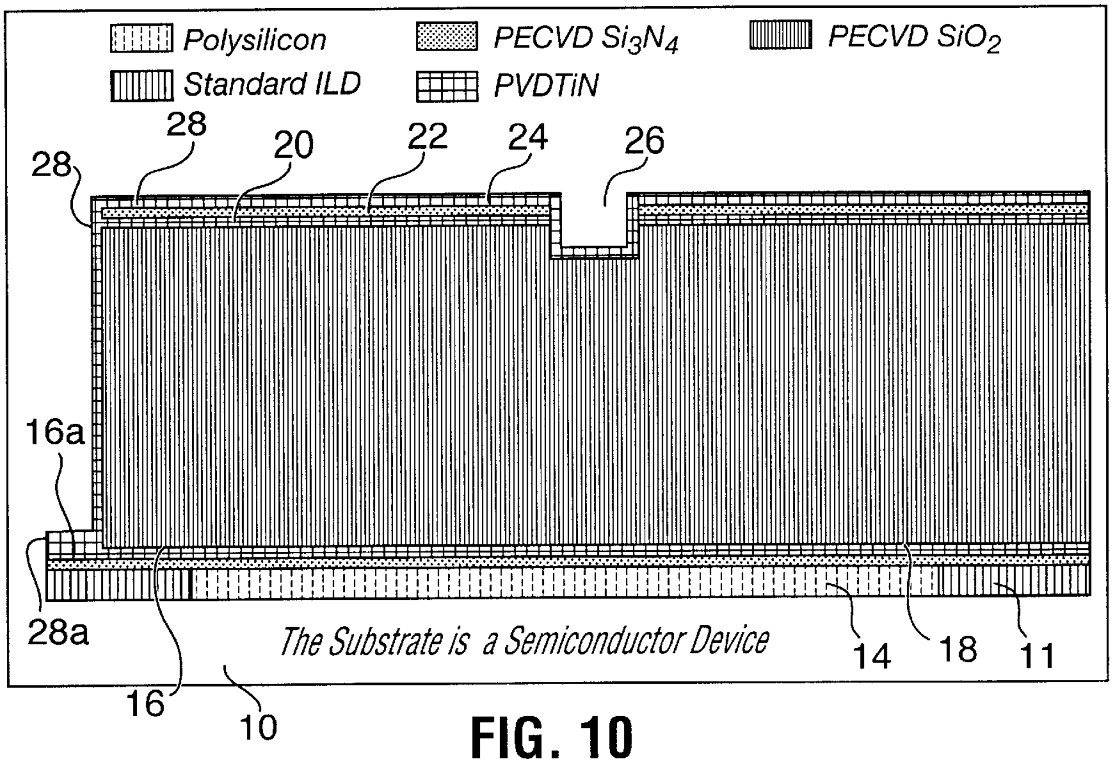
FIG. 10 illustrates step 9 of the biochip micro-machining sequence (Deposition of 0.10 $\mu$m of CRPVD TiN at 400° C.)
Figure 11:
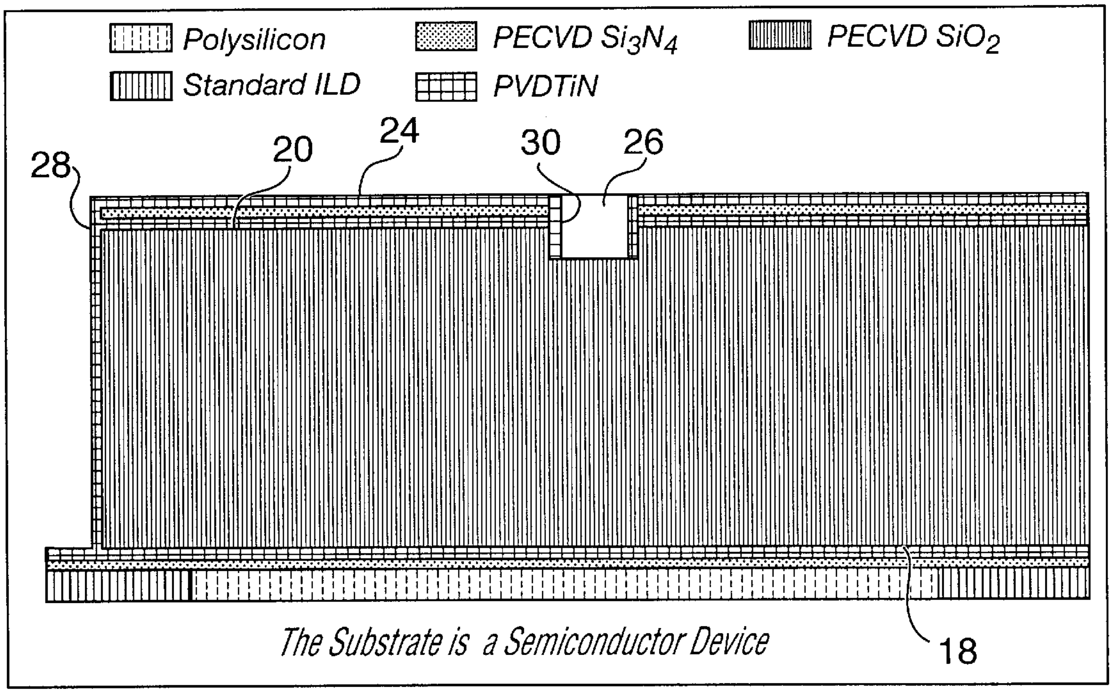
FIG. 11 illustrates step 10 of the biochip micro-machining sequence (Anisotropic Reactive Ion Etch-back of 0.10 $\mu$m of CRPVD TiN)

Next, as shown in FIG. 10, a layer 28 of about 0.10 $\mu$m of CRPVD TiN is deposited on layer 26 at 400° C. Then, as shown in FIG. 11, an Anisotropic RIE of the CRPVD TiN layer 28 is performed to provide CRPVD TiN ‘spacers’ 30 on vertical side-walls while removing the bottom layer to form openings where an Isotropic Wet Etching will be performed and also to remove the portion 28*a* extending over shoulder 16*a*. It will be understood that only one opening is shown in FIG. 11, although typically several will be present.

Figure 12:
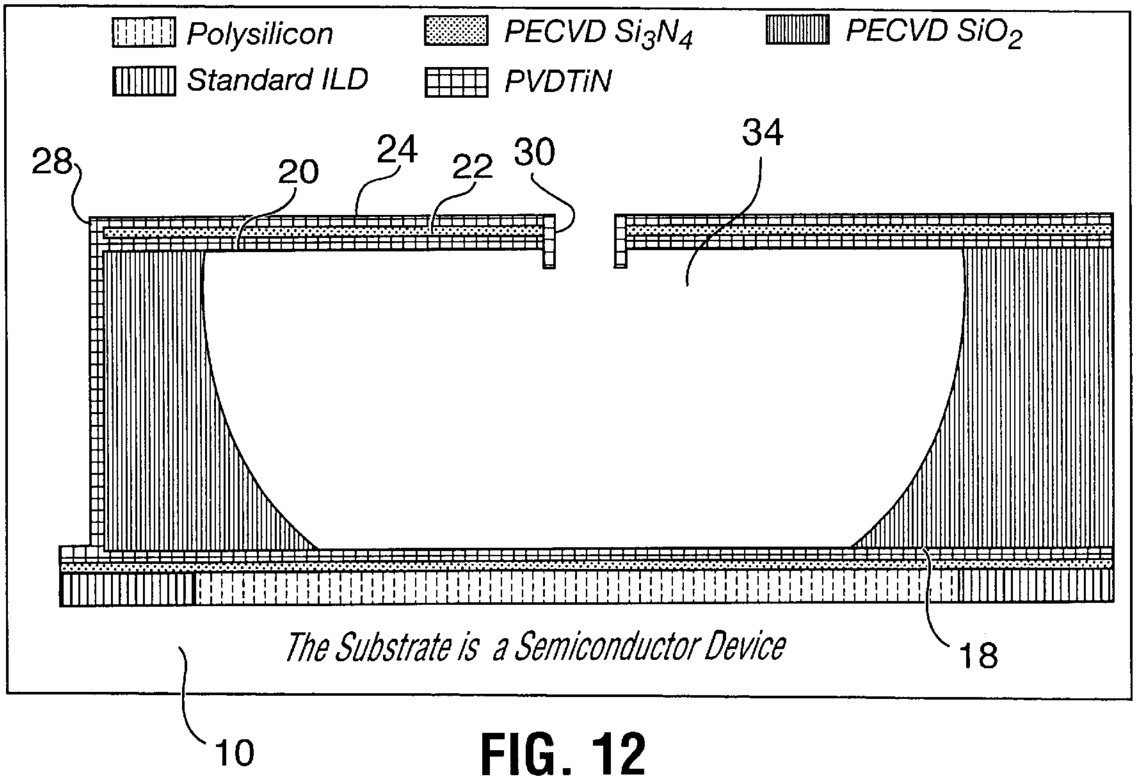
FIG. 12 illustrates step 11 of the biochip micro-machining sequence (Controlled Isotropic Wet Etching of the PECVD $SiO_2$)

In the next step, shown in FIG. 12., an Isotropic Wet Etch is performed on the PECVD $SiO_2$ 18 using either a mixture of Ethylene Glycol, $C_2H_4O_2H_2$, Ammonium Fluoride, $NH_4F$, and Acetic Acid, $CH_3COOH$, or alternately a mixture of Ammonium Fluoride, $NH_4F$, Hydrofluoric Acid, HF, and Water, $H_2O$, to define the micro-channels 34. These two Isotropic Wet Etchings are selective to CRPVD TiN which is used to protect the upper PECVD $Si_3N_4$ layer 22.

Figure 18:
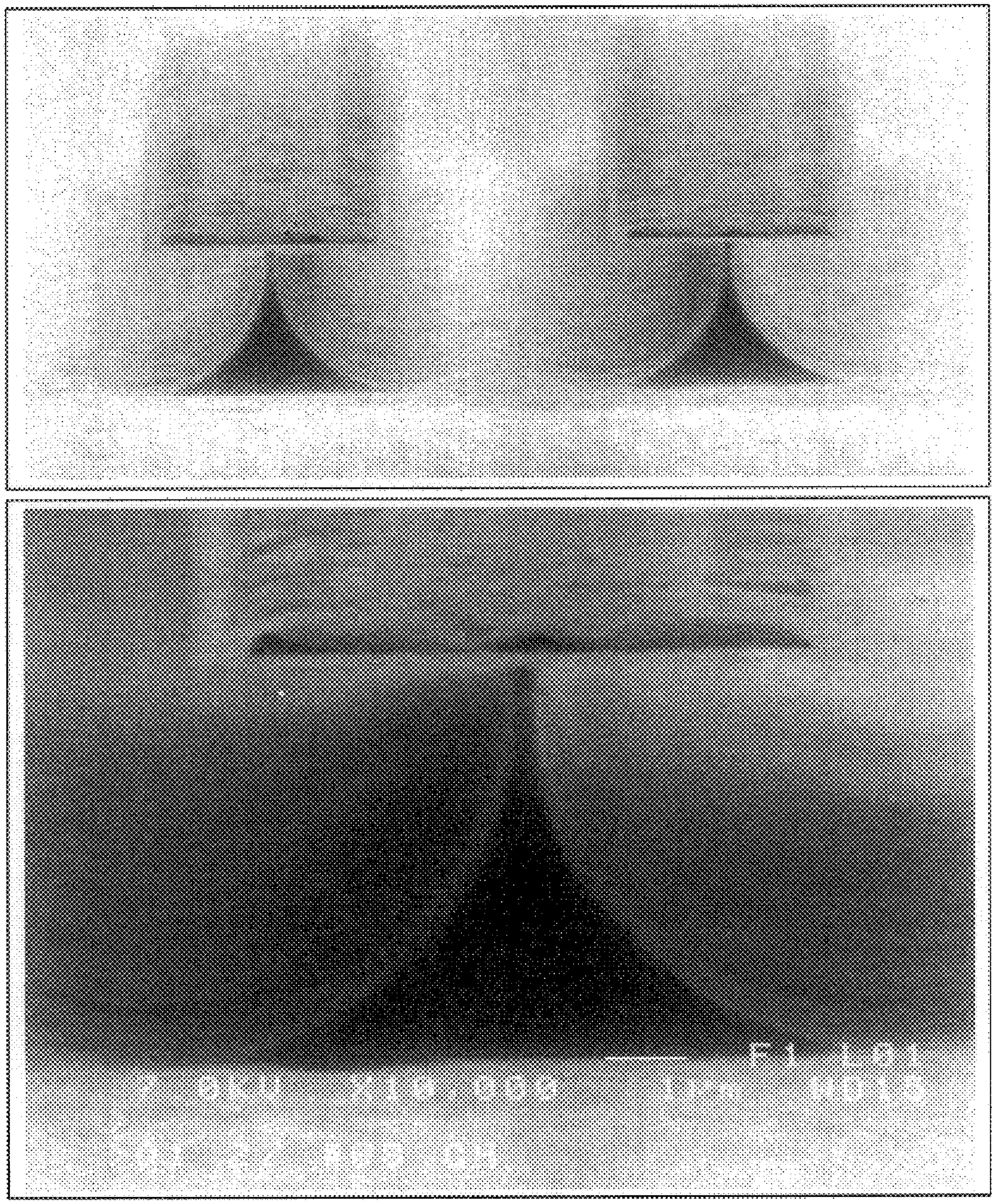
FIG. 18 shows scanning Electron Micrograph, SEM, cross sectional views demonstrating the excellent mechanical stability of a TiN layer to be suspended over the micro-channel.

Following the Isotropic Wet Etching, the CRPVD TiN/PECVD $Si_3N_4$/CRPVD TiN sandwich is suspended over the micro-channels 34. The mechanical properties and relative thickness of the CRPVD TiN layers 20, 22 and PECVD $Si_3N_4$ layer 22 are adjusted such that the structure is mechanically stable, i.e. does not bend-up or bend-down over the defined micro-channel, does not peel-off the edges of the underlying PECVD $SiO_2$, does not break-down or collapse. FIG. 18 shows a Scanning Electron Micrograph, SEM, cross sectional view demonstrating the excellent mechanical stability of a TiN layer to be suspended over the micro-channel. The pictures are for SEM purposes only and do not describe the optimum device. FIG. 18 shows a Scanning Electron Micrograph, SEM, top view demonstrating a micro-channel formed by wet etching thick PECVD $SiO_2$ through a 1.00 $\mu$m wide opening. The picture is for SEM purpose only and does not describe the optimum device.

Figure 13:
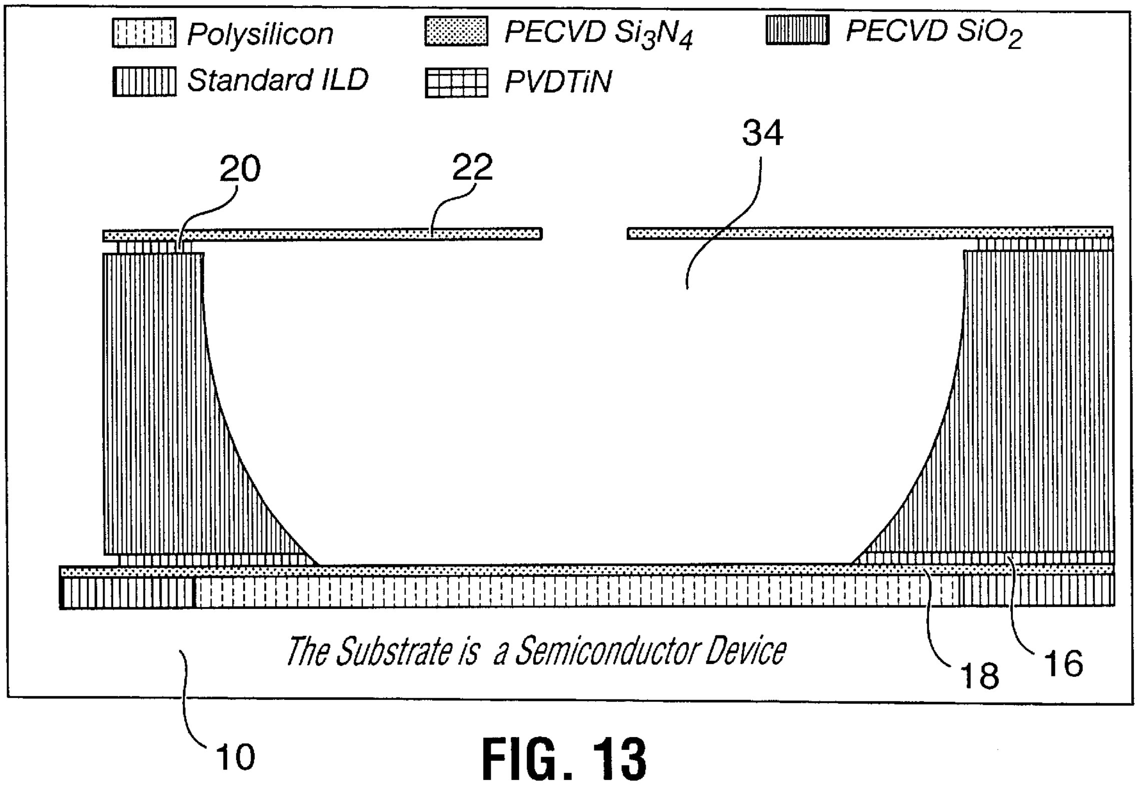
FIG. 13 illustrates step 12 of the biochip micro-machining sequence (Isotropic Wet Removal of Exposed CRPVD TiN with Some Undercut)

In the next step shown in FIG. 13, the Isotropic Wet Removal of the CRPVD TiN is performed using a mixture of Ammonium Hydroxide, $NH_4OH$, Hydrogen Peroxide, $H_2O_2$, and Water, $H_2O$. This Isotropic Wet Removal is selective to the PECVD $SiO_2$ and to the PECVD $Si_3N_4$. Following the Isotropic Wet Etching, the PECVD $Si_3N_4$ layer is suspended over the micro-channels so its mechanical properties and thickness are adjusted such that the layer is mechanically stable, i.e. does not bend-up or bend-down over the defined micro-channel, does not peel-off the edges of the underlying PECVD $SiO_2$, does not break-down or collapse.

Figure 19:
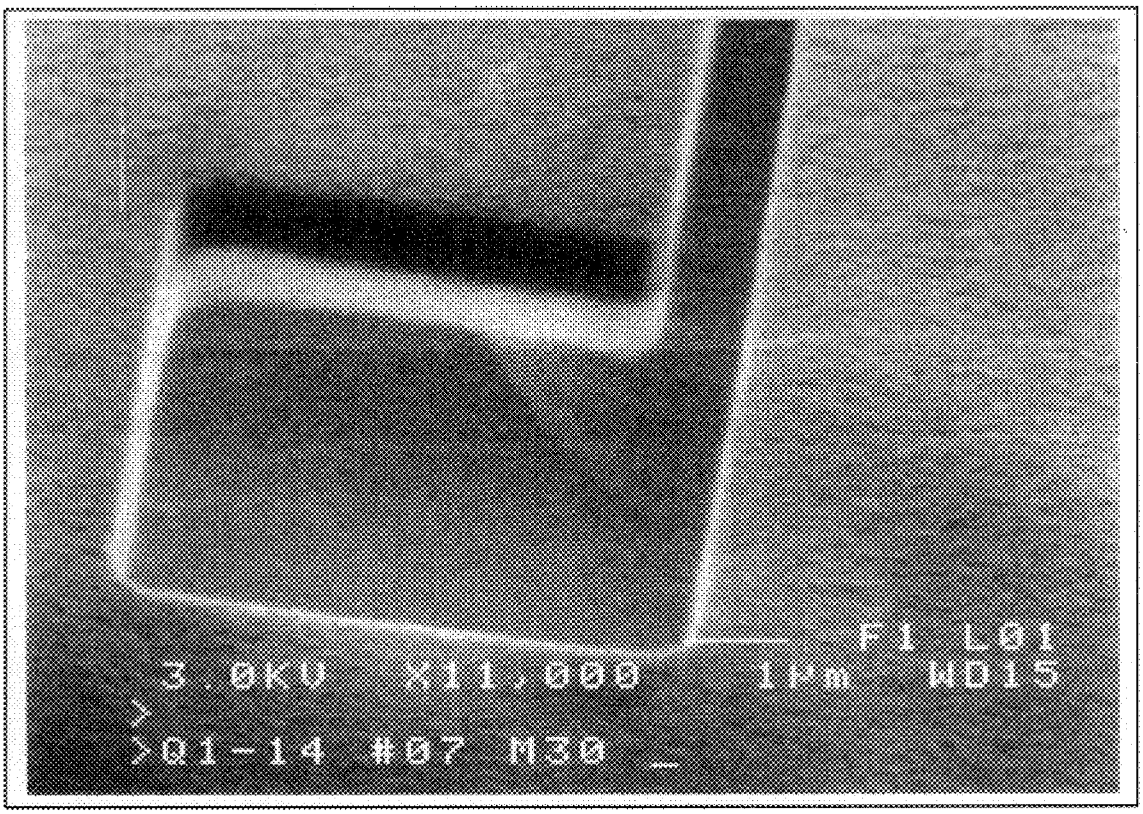
FIG. 19 is a Scanning Electron Micrograph, SEM, top view showing a micro-channel formed by wet etching thick PECVD $SiO_2$ through a 1.00 $\mu$m wide opening.
Figure 20:
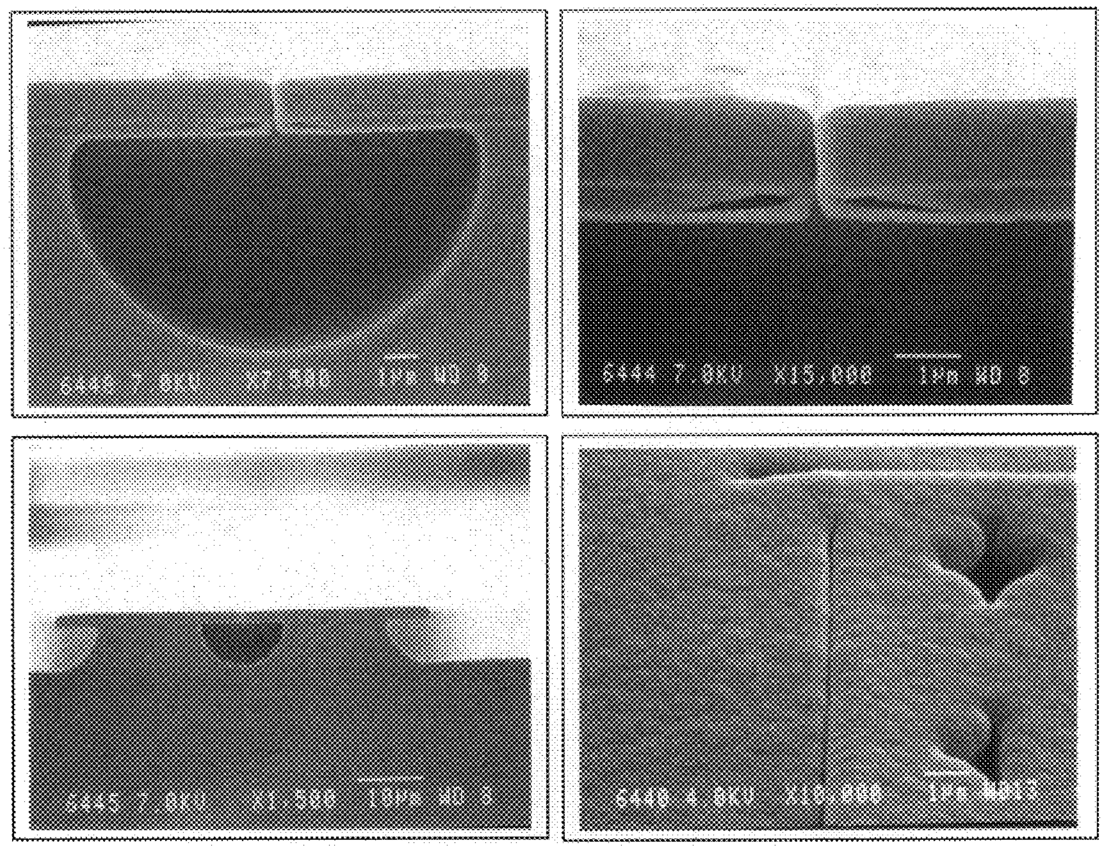
FIG. 20 is a Scanning Electron Micrograph, SEM, cross section views and top views showing the closure of the micro-channels with PECVD $SiO_2$.

In the following step, shown in FIG. 14, the closure of the opening 26 is effected with the deposition of a layer 40 of about 1.40 $\mu$m of PECVD $SiO_2$ at 400° C. This is possible because the natural overhang of PECVD $SiO_2$ on vertical surfaces allows a lateral growth of deposited material on these surfaces and ultimately, a closure of the openings. This closure of openings with PECVD $SiO_2$ is critical because it allows the formation of an enclosed micro-channel 34 without the need for bonding of two substrates, and unlike the prior art permits the fabrication of active micro-channels in contrast to opened micro-reservoirs. Some PECVD $SiO_2$ material 41 is deposited at the bottom of the micro-channel over the electrode 12. FIG. 19 shows Scanning Electron Micrograph, SEM, cross section views and top views demonstrating the closure of the micro-channels with PECVD $SiO_2$. Again, the pictures are for SEM purpose only and yet do not describe the optimum device.

In the next step shown in FIG. 15, a $3^{rd}$ micro-machining mask is applied to define the Isotropic Wet Etching of the upper PECVD $SiO_2$ where PVD Al-alloy electrodes will later be defined. This Isotropic Wet Etching of the upper PECVD $SiO_2$ using either a mixture of Ethylene Glycol, $C_2H_4O_2H_2$, Ammonium Fluoride, $NH_4F$, and Acetic Acid, $CH_3COOH$, or alternately a mixture of Ammonium Fluoride, $NH_4F$, Hydrofluoric Acid, HF, and Water, $H_2O$, is selective to the underlying PECVD $Si_3N_4$ layer inside as well as outside the MEMS region an leaves a bridge of $SiO_2$ 40 a closing the opening 26.

Figure 16:
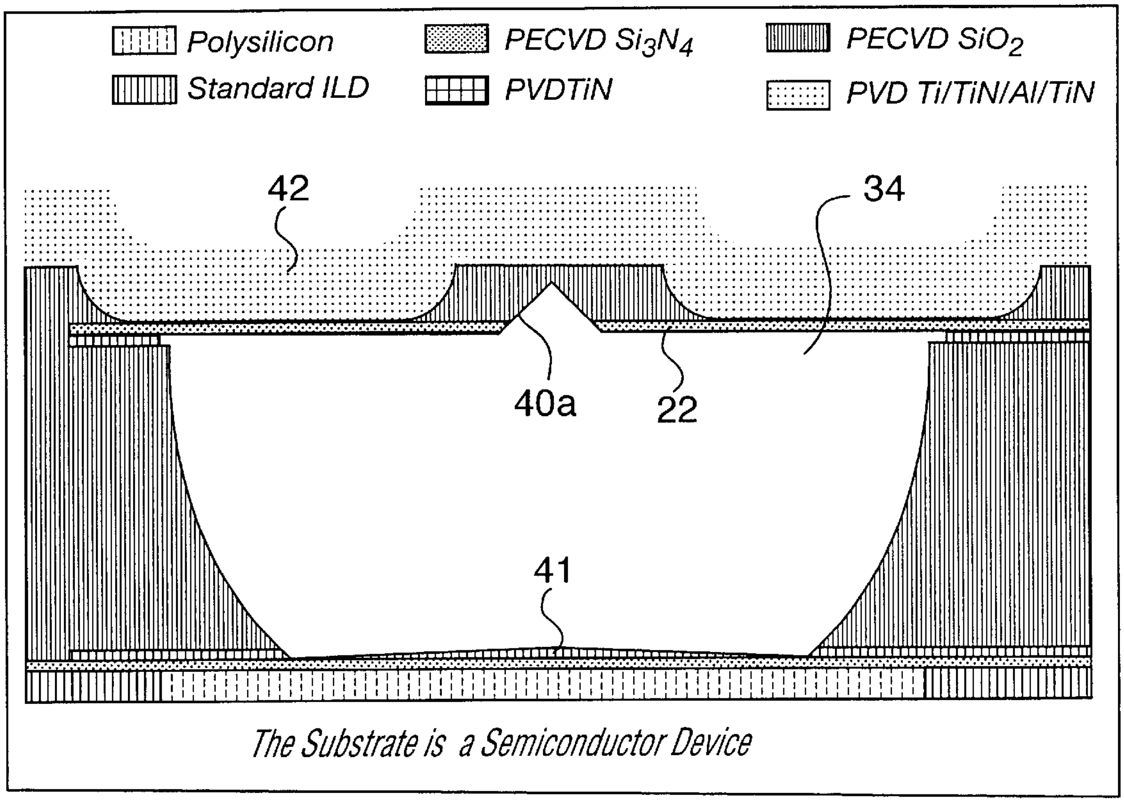
FIG. 16 illustrates step 15 of the biochip micro-machining sequence (Standard Deposition of PVD Ti/CRPVD TiN/PVD Al-alloy/CRPVD TiN at 400° C.)

Next, as shown in FIG. 16, the deposition of PVD Ti/CRPVD TiN/PVD Al-alloy/CRPVD TiN structure 42 at 400° C. is performed over the MEMS region to form as upper electrodes, as well as over the non-MEMS region, to form interconnections.

Figure 17:
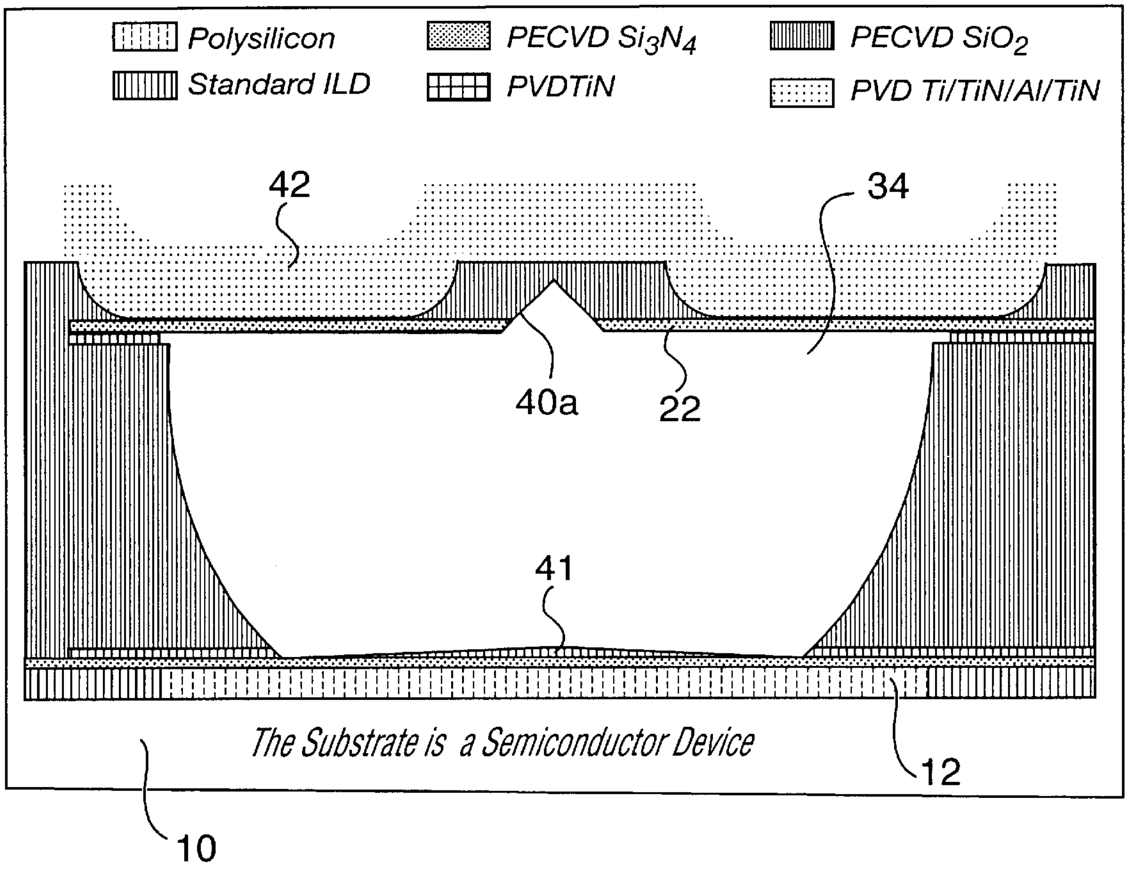
FIG. 17 illustrates step 16 of the biochip micro-machining sequence (Standard Anisotropic RIE of PVD Ti/CRPVD TiN/PVD Al-alloy/CRPVD TiN)

In the final step shown in FIG. 17, an Anisotropic RIE is performed on the of the PVD Ti/CRPVD TiN/PVD Al-alloy/CRPVD TiN layer 42, which defines upper electrodes in the MEMS region as well as interconnections over the non-MEMS region.

The combination of MEMS regions and non-MEMS regions now defines a biochip which can then be completed by processing the remaining standard CMOS manufacturing steps.

The person skilled in the art will understand that many variations to the process described are possible. For example, the substrate could have no active device at all and being used as a passive substrate. In that case, the micro-machining steps to achieve the closed micro-channels would provide a passive device which still has the advantage of providing an enclosed micro-channel without using thermal bonding with a second substrate. Examples of suitable substrates are: Silicon, Quartz, Sapphire, Alumina, acrylonitrile-butadiene-styrene copolymer, polycarbonate, polydimethylsiloxane (PDMS), polyethylene, polymethyl-methacrylate (PMMA), polymethylpentene, polypropylene, polystyrene, polysulfone, polytetrafluoroethylene (PTFE), polyurethane, polyvinylchloride (PVC), polyvinylidine fluoride (PVF).

The substrate could contain various types of Low-Voltage devices including: sensitive N-type MOS, sensitive P-Type MOS, high speed NPN Bipolar, high speed PNP Bipolar, Bipolar-NMOS, Bipolar-PMOS or any other semiconductor device capable of low signal detection and/or high speed operation. Alternatively, the substrate could contain various types of High-Voltage devices including: N-type Double Diffused Drain MOS, P-type Double Diffused Drain MOS, N-type Extended Drain MOS, P-type Extended Drain MOS, Bipolar NPN, Bipolar PNP, Bipolar-NMOS, Bipolar-PMOS, Bipolar-CMOS-DMOS, Trench MOS or any other semiconductor device capable of high voltage operation at voltages ranging from 10 to 2000 volts.

The substrate could be have a compound semiconductor portion capable of on-chip opto-electronic functions such as laser emission and photo-detection. In that case, the substrate could be: Silicon with such on-chip opto-electronic functions, III–V compound semiconductor, II–VI compound semiconductor, II–IV compound semiconductor or combinations of II–III–IV–V semiconductors.

The lower polysilicon or Al-alloy capacitor electrode of Step 0 could be replaced by other electrically conductive layers, such as: Copper, Gold, Platinum, Rhodium, Tungsten, Molybdenum, Silicides or Polycides.

The $Si_3N_4$ layer 14 could be made thicker or thinner if the selectivity of the Wet Etching (FIG. 12) is poorer or better to prevent excessive etch of the electrode located under this $Si_3N_4$ layer or it could simply be eliminated if the fluid has to be in physical contact with the electrode located under this $Si_3N_4$ layer.

The sacrificial TiN layer 16 could be made thicker, thinner or simply eliminated if the selectivity of the Wet Etching (FIG. 17) is poorer, better or simply good enough to prevent excessive etch of the material located under this sacrificial TiN layer, or it simply be eliminated if the fluid to be present inside the micro-channel has to be in physical contact with the electrode located under this TiN layer. The $SiO_2$ layer 18 of the micro-channel defined could be made thicker or thinner than 10.0 $\mu$m depending upon the required size of micro-channel. Alternatively, this $SiO_2$ material could be replaced by a deposited thin/thick polymer film (using plasma-polymerization or other thin/thick polymer film deposition technique) such as: acrylonitrile-butadiene-styrene copolymer, polycarbonate, polydimethylsiloxane (PDMS), polyethylene, polymethylmethacrylate (PMMA), polymethylpentene, polypropylene, polystyrene, polysulfone, polytetrafluoroethylene (PTFE), polyurethane, polyvinylchloride (PVC), polyvinylidine fluoride (PVF). In this case a suitable Isotropic Wet Etching selective to the other layers has to be developed to define the micro-channel into the thin/thick polymer film; the same thin/thick polymer film deposition technique could be used to ensure the closure of the openings over the micro-channels; lower metallization temperatures would have to be used to prevent the thermal decomposition of the polymeric films.

The $SiO_2$ material of the micro-channel 18 could be replaced by a spun-on polyimide layer. In this case an Isotropic Wet Etching selective to the other layers would have to be used as to allow the formation of the micro-channel into the polyimide film; the same thin/thick polymer film deposition technique could be used to ensure the closure of the openings over the micro-channels; lower metallization temperatures would have to be used to prevent the thermal decomposition of the polyimide film.

The $SiO_2$ material 18 could also be alloyed with different elements such as: Hydrogen, Boron, Carbon, Nitrogen, Fluorine, Aluminum, Phosphorus, Chlorine, or Arsenic.

This PECVD $SiO_2$ material 18 could be deposited by technique other than PECVD, including: Low Pressure Chemical Vapor Deposition, LPCVD, Metal Organic Chemical Vapor Deposition, MOCVD, Electron Cyclotron Resonance Deposition, ECRD, Radio Frequency Sputtering Deposition, RFSD.

The sacrificial TiN layer 20 could be made thicker, thinner or simply eliminated if the selectivity of the Wet Etching (FIG. 12) is poorer, better or simply good enough to prevent excessive etch of the material located over this sacrificial TiN layer.

The sacrificial TiN layers 20, 24 and 28 could be replaced by another sacrificial layer having mechanical properties preventing warpage, delamination, cracking or other degradation of the suspended structured excellent selectivity to Isotropic Wet Etching solutions used to define the micro-channels.

The sacrificial CRPVD TiN layers could be deposited by another technique, including: Metal Organic Chemical Vapor Deposition, MOCVD, Low Pressure Chemical Vapor Deposition, LPCVD, Plasma Enhanced Chemical Vapour Deposition, PECVD, Long Through Deposition, LTD, Hollow Cathode Deposition, HCD, and High Pressure Ionization Deposition, HPID.

The upper $Si_3N_4$ layer 22 could be made thicker or thinner than 0.40 $\mu$m depending on its mechanical properties and on the mechanical properties of the surrounding materials to prevent mechanical problems such as plastic deformation, peeling, cracking, de-lamination and other such problems in the etching step shown in FIG. 12.

The sacrificial TiN layer 23 could be made thicker, thinner or simply eliminated if the selectivity of the Wet Etching of FIG. 12 is poorer, better or simply good enough to prevent excessive etch of the material located under this sacrificial TiN layer.

The partial Anisotropic RIE shown in FIG. 8 could be eliminated if there is no need to define MEMS regions and non-MEMS regions in the device.

The deposition and partial RIE of the CRPVD TiN respectively illustrated in FIG. 10 and FIG. 11 providing CRPVD TiN 'spacers' on vertical side-walls of the openings could be eliminated if the selectivity of the Wet Etching shown in FIG. 12 is such that there is no need of having this CRPVD TiN 'spacers' on vertical side-walls of the openings.

The sacrificial TiN layer 28 shown FIG. 10 could be made thicker or thinner if the selectivity of the Wet Etching shown in FIG. 12) is poorer or better to prevent excessive etch of the material located behind this sacrificial TiN layer.

The Wet Isotropic Etching of PECVD $SiO_2$ shown in FIG. 12 could be performed using other liquid mixtures than either: a) the $C_2H_4O_2H_2$, $NH_4F$, and $CH_3COOH$, or alternately b) $NH_4F$, HF, and $H_2O$, to properly define the micro-channels. Any other Isotropic Wet Etchings of PECVD $SiO_2$ could be used if they are selective enough to the bottom layer of 14 (or to the bottom electrode12 if no such bottom layer is used) and to the combination of layers becoming suspended during this Isotropic Wet Etching.

The Isotropic Wet Removal of the CRPVD TiN shown in FIG. 13 can be eliminated if sacrificial CRPVD TiN is not used in the sequence. The Isotropic Wet Removal of the CRPVD TiN shown in FIG. 13 could also be performed using other liquid mixtures than $NH_4OH$, $H_2O_2$, and $H_2O$ if the Isotropic Wet Removal is selective to the PECVD $SiO_2$ and to the other layers in contact with the Isotropic Wet Removal.

Figure 14:
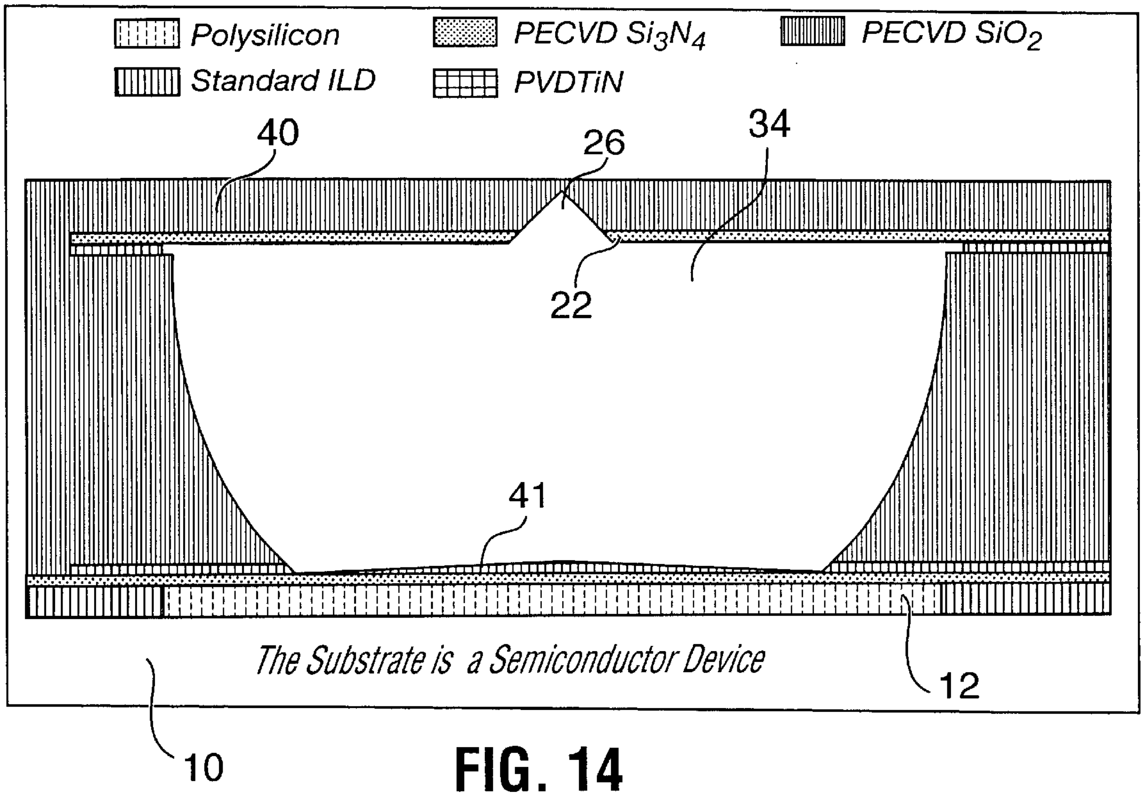
FIG. 14 illustrates step 13 of the biochip micro-machining sequence (Deposition of 1.40 $\mu$m of PECVD $SiO_2$ at 400° C.)

The $SiO_2$ material of the micro-channel shown in FIG. 14 could be made thicker or thinner than 1.40 $\mu$m depending upon the size of opening to be filled.

The $SiO_2$ material of the micro-channel shown in FIG. 14 could be replaced by a deposited polymer film (using plasma-polymerization or other thin/thick polymer film deposition technique) such as: acrylonitrile-butadiene-styrene copolymer, polycarbonate, polydimethylsiloxane (PDMS), polyethylene, polymethylmethacrylate (PMMA), polymethylpentene, polypropylene, polystyrene, polysulfone, polytetrafluoroethylene (PTFE), polyurethane, polyvinylchloride (PVC), polyvinylidine fluoride (PVF). The $SiO_2$ material of the micro-channel could also be alloyed with different elements such as: Hydrogen, Boron, Carbon, Nitrogen, Fluorine, Aluminum, Phosphorus, Chlorine, or Arsenic.

The PECVD $SiO_2$ material of the micro-channel shown in FIG. 14 could be deposited by another technique than PECVD, including: Low Pressure Chemical Vapor Deposition, LPCVD, Metal Organic Chemical Vapor Deposition, MOCVD, Electron Cyclotron Resonance Deposition, ECRD, Radio Frequency Sputtering Deposition, RFSD and could incorporate the use of a filling technique such as Spin-On Glass, SOG, as to provide a smooth seamless upper surface.

Figure 15:
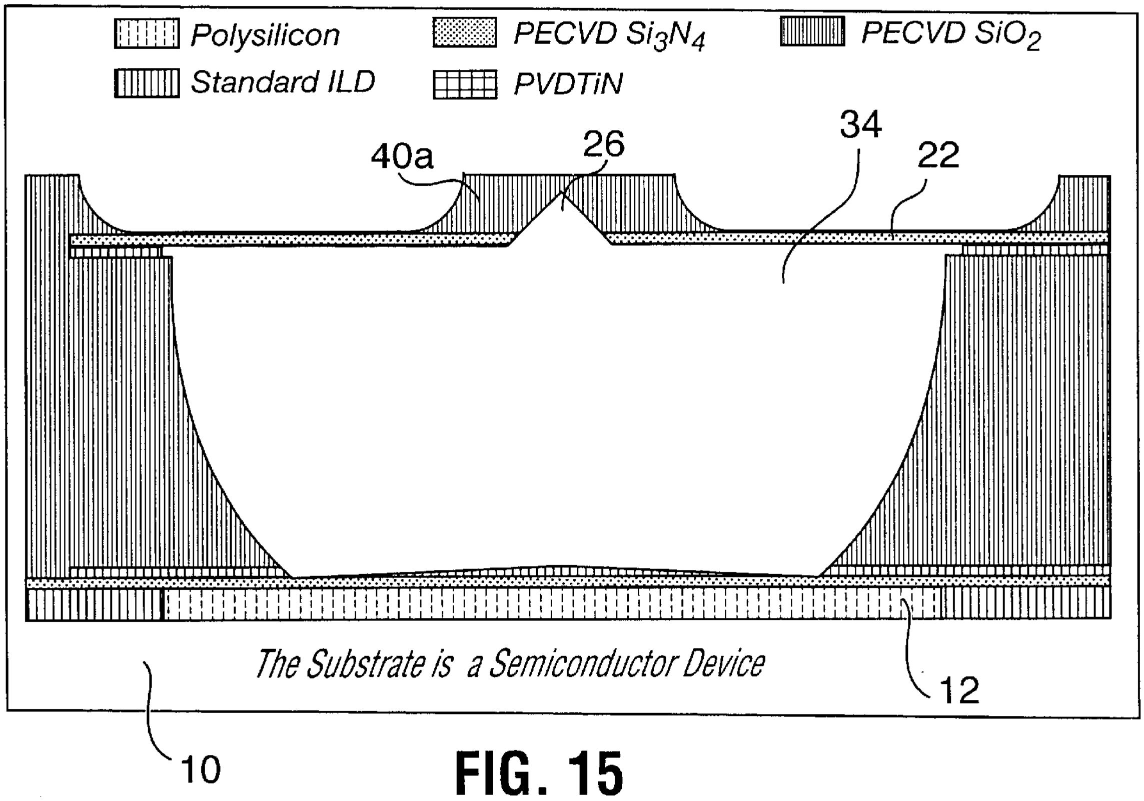
FIG. 15 illustrates step 14 of the biochip micro-machining sequence (3rd Pattern and Isotropic Wet Etching of the PECVD $SiO_2$ at 400° C.)

The Isotropic Wet Etching of the upper PECVD $SiO_2$ shown in FIG. 15 could be performed using other liquid mixtures than: a) the $C_2H_4O_2H_2$, $NH_4F$, and $CH_3COOH$, or alternately b) $NH_4F$, HF, and $H_2O$. Other Isotropic Wet Etchings could be used if selective enough to the bottom suspended layer of FIG. 13.

The Isotropic Wet Etching of the upper PECVD $SiO_2$ shown in FIG. 15 could be replaced by a suitable Dry Etch if such an etch is selective enough to the bottom suspended layer of FIG. 13.

The upper Al-Alloy electrode shown in FIGS. 16 and 17 could be eliminated to minimize the number of micro-machining steps.

The upper Al-Alloy electrode shown in FIG. 16 could be replaced by a higher melting point conductive layer if the other layers can be combined in such a way to prevent mechanical problems such as plastic deformation, peeling, cracking, de-lamination and other such high temperature related problems. In that case, the 450° C. temperature limitation of the described micro-machining steps could be increased to 750° C. without degradation of the underlying CMOS and high-voltage CMOS devices.

The upper PVD Ti/CRPVD TiN/PVD Al-alloy/CRPVD TiN electrode shown in FIG. 16 could be replaced by LPCVD polysilicon, at temperatures ranging from 530 to 730° C. or by Plasma Enhanced Chemical Vapour Deposited polysilicon, PECVD polysilicon from 330 to 630° C. if the other layers can be combined in such a way as to prevent mechanical problems such as: plastic deformation, peeling, cracking, de-lamination and other high temperature related problems. In that case, the 450° C. limitation of the described micro-machining steps could be increased to 750° C. without degradation of the underlying CMOS and high-voltage CMOS devices.

The upper PVD Ti/CRPVD TiN/PVD Al-alloy/CRPVD TiN shown in FIG. 16 could also be replaced by another interconnect structure and deposited at another temperature than at 400° C.

The invention may be applied in applications which involve the use of active (i.e. on-chip electronics) micro-channels, such as micro-fluidics applications other than the mentioned detection and/or fluid movement; Micro-chemical detection/analysis/reactor systems; Micro-biological detection/analysis/reactor systems; Micro-bio-chemical detection/analysis/reactor systems; Micro-opto-fluidics systems; Micro-fluid delivery systems; Micro-fluid interconnect systems; Micro-fluid transport systems; Micro-fluid mixing systems; Micro-valves/pumps systems; Micro flow/pressure systems; Micro-fluid control systems; Micro-heating/cooling systems; Micro-fluidic packaging; Micro-inkjet printing; Laboratory-on-a-chip, LOAC, devices; and Other MEMS requiring micro-channels; Other MEMS requiring an enclosed channel.

The invention may also be applied to applications which involve the use of passive (i.e. off-chip electronics) micro-channels, such as Micro-chemical detection/analysis systems; Micro-biological detection/analysis systems; Micro-bio-chemical detection/analysis systems; Micro-opto-fluidics systems; Micro-fluid delivery systems; Micro-fluid interconnect systems; Micro-fluid transport systems; Micro-fluid mixing systems; Micro-valves/pumps systems; Micro flow/pressure systems; Micro-fluid control systems; Micro-heating/cooling systems; Micro-fluidic packaging; Micro-inkjet printing; Laboratory-on-a-chip, LOAC, devices; Other MEMS requiring micro-channels; and Other MEMS requiring an enclosed channel.

The invention relates to an improved fabrication technique for micro-channel biochip devices, preferably active devices from an active micro-machined silicon substrate that results in a sophisticated biochip device which can perform, via fluid movement into micro-channels, various fluidics, analysis and data communication functions without the need of an external fluid processor in charge of fluid movement, analysis and data generation.

We claim:

1. A method of fabricating a microstructure for microfluidics applications, comprising the steps of:

forming a first layer of etchable material on a suitable substrate;

forming a mechanically stable support layer over said etchable material;

applying a mask over said support layer to expose at least one opening in said mask;

performing at anistropic etch through each said opening to create a bore extending through said support layer to said layer of etchable material;

performing an isotropic etch through each said bore to form a microchannel in said etchable material extending under said support layer;

forming a further layer of depositable material over said support layer until portions of said depositable layer overhanging each said opening meet and thereby close the microchannel formed under each said opening; and wherein a first sacrificial layer is deposited under said support layer, a second sacrificial layer is deposited on top of said support layer, and each said sacrificial layer is removed by etching at least in the vicinity of said microchannel after formation thereof.

2. A method as claimed in claim 1, wherein said further layer is of the same material as said first layer of etchable material.

3. A method as claimed in claim 2, wherein said etchable material is $SiO_2$.

4. A method as claimed in claim 3, wherein said support layer is made of $Si_3N_4$.

5. A method as claimed in claim 1, wherein said first layer is deposited by PECVD.

6. A method as claimed in claim 5, wherein said first layer is about 10 $\mu$m thick.

7. A method as claimed in claim 1, wherein each said sacrificial layer is TiN.

8. A method as claimed in claim 7, wherein each said sacrificial layer is formed by collimated reactive physical vapour deposition (CRPVD).

9. A method as claimed in claim 8, wherein said anisotropic etch through said support layer is a reactive ion anisotropic etch.

10. A method as claimed in claim 9, wherein an anisoptropic etch is performed on said microstructure through said etchable material to define a MEMS region containing said microchannel.

11. A method as claimed in claim 1, wherein after etching said bore an additional layer is deposited over said support layer so as to extend into said bore covering sidewalls and a bottom thereof, and a portion of said additional layer covering said bottom of said bore is etched away to leave sidewall spacers in said bore through which said isotropic etch is performed in order to form said microchannel.

12. A method as claimed in claim 11, wherein said additional layer is TiN.

13. A method as claimed in claim 12, wherein said additional layer is deposited by CRPVD.

14. A method as claimed in claim 1, wherein said substrate includes CMOS circuitry.

15. A method as claimed in claim 1, wherein said first layer is deposited over a conductive layer forming a lower electrode.

16. A method as claimed in claim 15, wherein said conductive layer is polysilicon.

17. A method as claimed in claim 16, wherein a protective layer is formed between said conductive layer and said first layer.

18. A method as claimed in claim 17, wherein said protective layer is $Si_3N_4$.

19. A method as claimed in claim 18, wherein a further conductive layer is formed over said protective layer.

20. A method as claimed in claim 19, wherein said further conductive layer is TiN.

21. A method as claimed in claim 1, wherein said further conductive layer is formed by CRPVD.

22. A method as claimed in claim 21, wherein said further conductive layer is deposited at about 400° C.

23. A method as claimed in claim 1, wherein after forming said further layer, an etch step is performed to remove said further layer from said supporting layer except in the region of said opening, and then a conductive layer is deposited to provide an upper electrode.

24. A method as claimed in claim 23, wherein said conductive layer comprises PVD Ti/TiN/al/Tin sublayers.

25. A method as claimed in claim 24, wherein an anisotropic etch is performed on said sublayers to define electrodes and interconnects for said microstructure.

26. A method as claimed in claim 25, wherein said steps are carried out at a temperature not exceeding 450° C.

27. A method of fabricating a microstructure for microfluidics applications, comprising:

providing a substrate containing CMOS circuitry having an upper conductive layer;

forming a protective layer on said upper conductive layer;

forming a first sacrificial layer on said protective layer;

forming a first layer of etchable material on said protective layer;

depositing a second sacrificial layer on said first layer;

depositing a mechanically stable support layer on said second sacrificial layer;

applying a mask over said support layer to expose at least one opening in said mask;

performing an anistropic etch through the said opening to create a bore extending through said support layer to said layer of etchable material;

performing an isotropic etch through each said bore to form a microchannel in said etchable material extending under said support layer; and forming a further layer of depositable material aver said support layer until portions of said depositable layer overhanging each said opening meet and thereby close the microchannel formed under each said opening;

removing said depositable material in regions not over said opening;

and depositing a conductive layer over said depositable material to form an upper electrode.

28. A method as claimed in claim 27, further comprising depositing a third sacrificial layer over said support layer.

29. A method as claimed in claim 28, wherein said sacrificial layers are TiN.

30. A method as claimed in claim 29, wherein said sacrificial layers are deposited by collimated reactive physical vapour deposition (CRPVD).

31. A method as claimed in claim 30, wherein said first layer is $SiO_2$.

32. A method as claimed in claim 31, wherein said first layer is deposited by PECVD.

33. A method as claimed in claim 32, wherein said first layer is about 10 $\mu$m thick.

34. A method as claimed in claim 27, wherein after performing said anisotropic etch to create said bore, a further sacrificial layer is deposited to extend into said bore, and a bottom portion of said sacrificial layer is etched away to leave sidewall spacers in said bore while said isotropic etch is performed to form said microchannel.

35. A method as claimed in claim 27, wherein said process steps are carried out at temperature not exceeding 450° C.

36. A method as claimed in claim 34, wherein said further sacrificial layer is TiN.

37. A method of fabricating a fluidic device, comprising the steps of:

providing a layer of etchable material;

depositing a first sacrificial layer over said layer of etchable material;

forming a protective layer over said first sacrificial layer;

depositing a second sacrificial layer over said protective layer;

providing at least one opening in said protective layer and said first and second sacrificial layers;

etching a cavity in said etchable layer through said at least one opening;

etching away said first and second sacrificial layers at least in the vicinity of said cavity;

depositing a further layer over said protective layer such that portions thereof overhang said at least one opening, said overhanging portions meeting to close said opening and thereby form a closed microchannel within said etchable layer.

38. A method as claimed in claim 37, wherein said etchable material is $SiO_2$.

39. A method as claimed in claim 38, wherein said further layer is $SiO_2$.

40. A method as claimed in claim 39, wherein said protective layer is $Si_3N_4$.

41. A method as claimed in claim 37, wherein said opening is protected with sidewall spacers during said etching of said cavity.

42. A method as claimed in claim 41, wherein said spacers are TiN.

* * * * *